(12) United States Patent
Min

(10) Patent No.: US 7,994,597 B2
(45) Date of Patent: Aug. 9, 2011

(54) MRAM WITH COUPLING VALVE SWITCHING

(75) Inventor: Tai Min, San Jose, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 218 days.

(21) Appl. No.: 12/381,567

(22) Filed: Mar. 13, 2009

(65) Prior Publication Data

US 2010/0232215 A1 Sep. 16, 2010

(51) Int. Cl.
*G11C 11/02* (2006.01)

(52) U.S. Cl. ......... 257/421; 257/E21.665; 257/E27.006; 365/158; 438/3

(58) Field of Classification Search ............... 257/421, 257/422, 427, E21.665, E27.006; 365/158; 438/3
See application file for complete search history.

(56) References Cited

U.S. PATENT DOCUMENTS

| | | | |
|---|---|---|---|
| 6,385,082 B1 | 5/2002 | Abraham et al. | |
| 6,535,416 B1 * | 3/2003 | Daughton et al. | ............ 365/145 |
| 6,704,220 B2 | 3/2004 | Leuschner | |
| 6,744,086 B2 * | 6/2004 | Daughton et al. | ............ 257/295 |
| 6,771,534 B2 | 8/2004 | Stipe | |
| 6,963,098 B2 * | 11/2005 | Daughton et al. | ............ 257/295 |
| 7,023,723 B2 * | 4/2006 | Daughton et al. | ............ 365/158 |
| 7,110,287 B2 | 9/2006 | Huai et al. | |
| 7,148,531 B2 * | 12/2006 | Daughton et al. | ............ 257/295 |
| 7,177,178 B2 * | 2/2007 | Daughton et al. | ............ 365/158 |
| 7,230,844 B2 | 6/2007 | Deak | |
| 7,266,013 B2 * | 9/2007 | Daughton et al. | ............ 365/158 |
| 7,309,617 B2 | 12/2007 | Ruehrig et al. | |
| 7,357,995 B2 | 4/2008 | Parkin | |
| 7,375,405 B2 | 5/2008 | Fukuzawa et al. | |
| 7,813,165 B2 * | 10/2010 | Daughton et al. | ............ 365/158 |
| 7,868,404 B2 * | 1/2011 | Deak | ............ 257/421 |
| 7,929,370 B2 * | 4/2011 | Min | ............ 365/225.5 |
| 2007/0063237 A1 * | 3/2007 | Huai et al. | ............ 257/295 |
| 2008/0180991 A1 | 7/2008 | Wang | |
| 2010/0002501 A1 * | 1/2010 | Leuschner et al. | ............ 365/171 |

OTHER PUBLICATIONS

"Thermally Assisted Switching in Exchange-Biased Storage Layer Magnetic Tunnel Junctions," by I.L. Prejbeanu et al., IEEE Transactions on Magnetics, vol. 40, No. 4, Jul. 2004, pp. 2625-2627.

* cited by examiner

*Primary Examiner* — Anh Phung
*Assistant Examiner* — Michael Lulis
(74) *Attorney, Agent, or Firm* — Saile Ackerman LLC; Stephen B. Ackerman

(57) ABSTRACT

The free layer in a magneto-resistive memory element is stabilized through being pinned by an antiferromagnetic layer. A control valve layer provides exchange coupling between this antiferromagnetic layer and the free layer. When writing data into the free layer, the control valve layer is heated above its curie point thereby temporarily uncoupling the free layer from said antiferromagnetic layer. Once the control valve cools, the free layer magnetization is once again pinned by the antiferromagnetic layer.

26 Claims, 4 Drawing Sheets

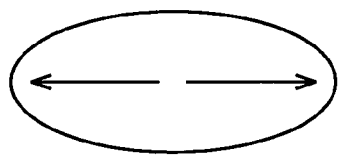
*FIG. 1a - Prior Art*
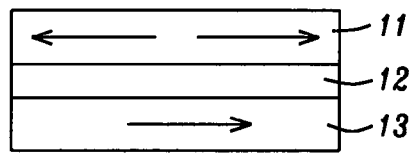
*FIG. 1b - Prior Art*
*FIG. 2 - Prior Art*
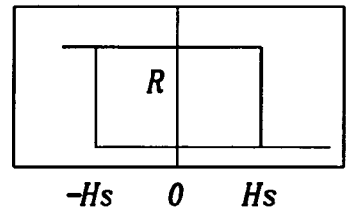
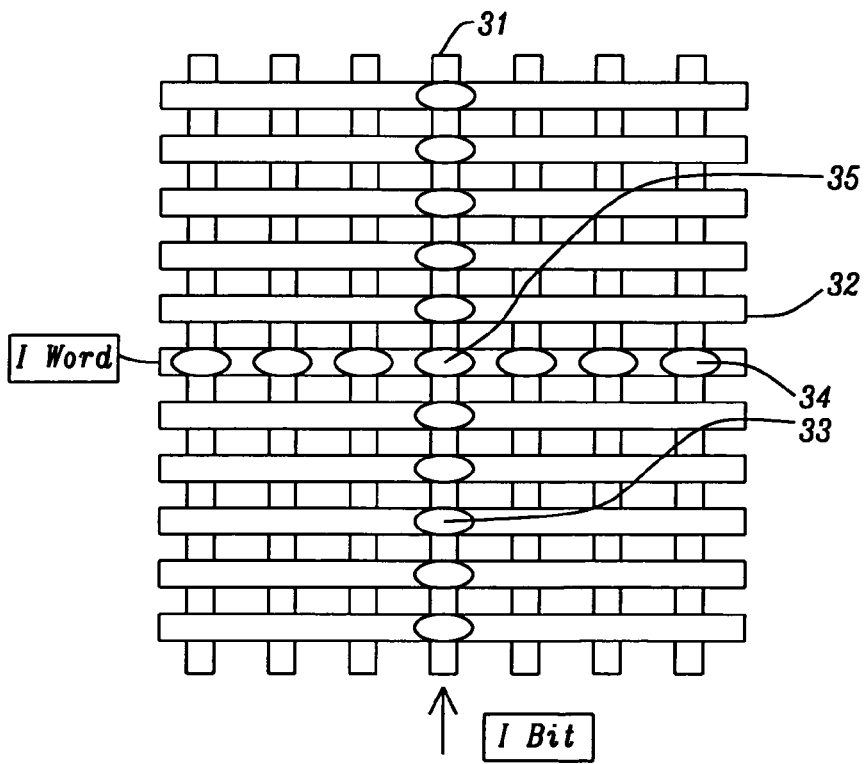
*FIG. 3 - Prior Art*

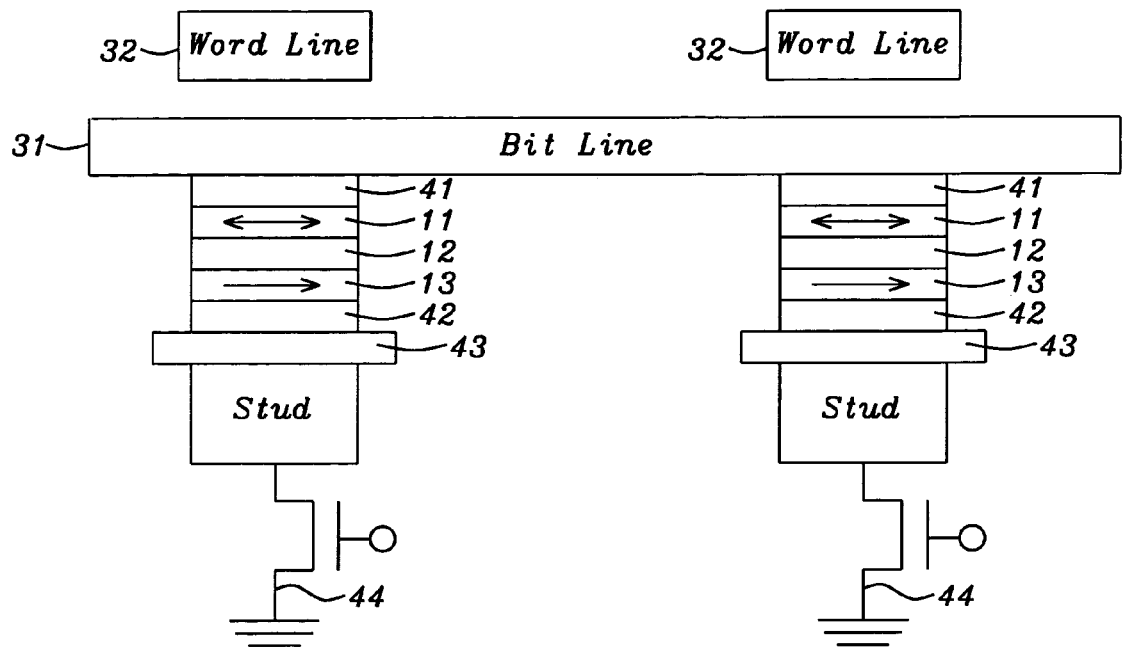
FIG. 4 – Prior Art
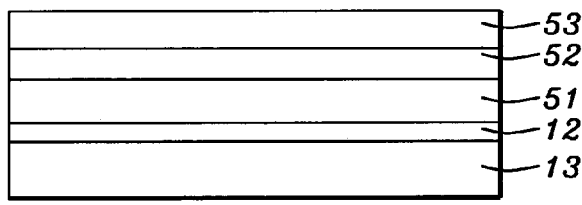
FIG. 5a
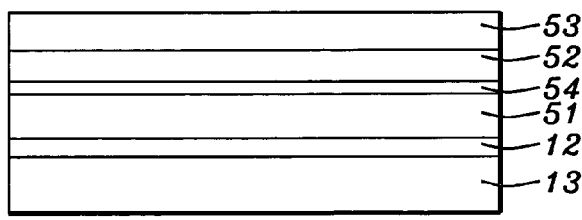
FIG. 5b

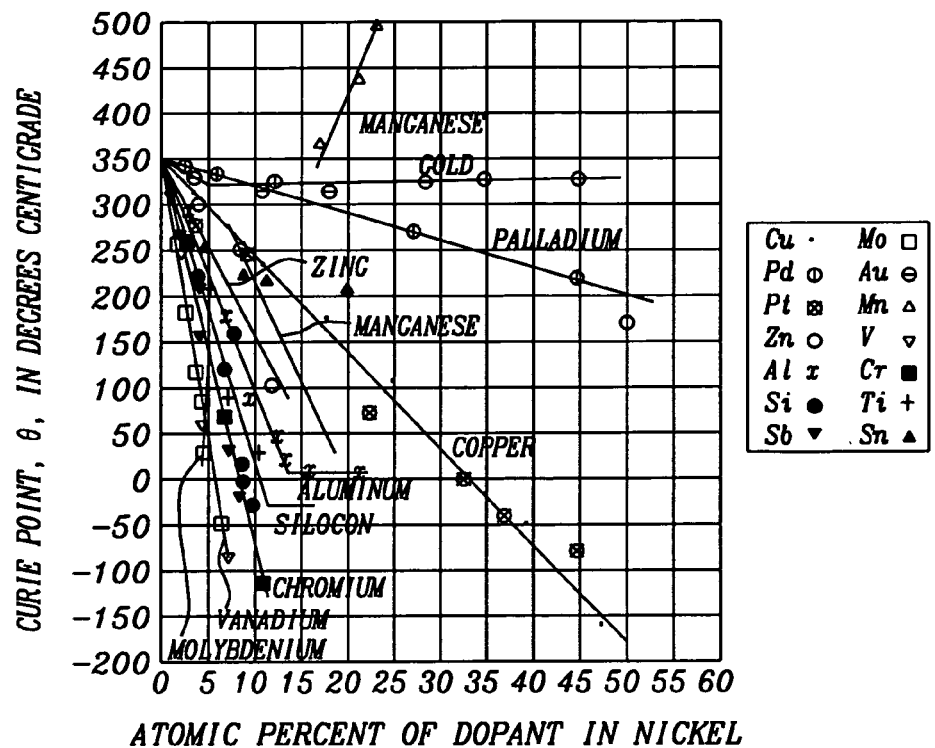
FIG. 6 - Prior Art
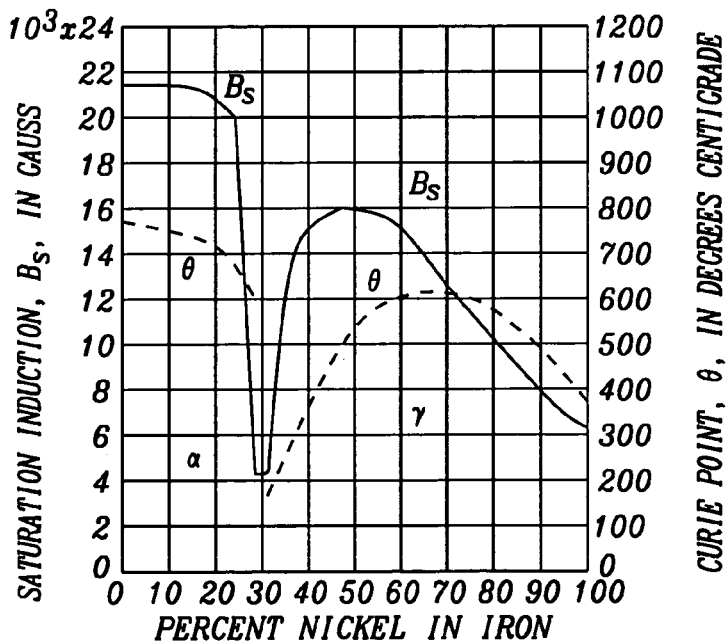
FIG. 7 - Prior Art

MRAM WITH COUPLING VALVE SWITCHING

FIELD OF THE INVENTION

The invention relates to the general field of magneto-resistive memory arrays with particular emphasis on how information is stored and, more particularly, with overcoming high programming current and scaling problems.

BACKGROUND OF THE INVENTION

Magnetic tunneling junction (MTJ) or Giant magneto-Resistance (GMR)/Spin Valve (SV) with two ferromagnetic layer separated by a non-magnetic layer—a tunneling oxide layer for MTJ or a transitional metal for GMR/SV—have been widely studied for use as a memory element in, for example, a Magnetic Random Access Memory (MRAM). Usually, one of these ferromagnetic layers (reference or pinned layer) is magnetized in a fixed direction while the other layer is free to switch its magnetization direction (free layer).

For MRAM applications, the magnetizations of both free and reference layers are in the film plane, as illustrated by FIG. 1a. The anisotropy field that keeps the free layer magnetization parallel or anti-parallel to the reference layer is usually generated through shape anisotropy that occurs when the shape deviates from a circle, e.g. as an ellipse. In the quiescent state, the free layer magnetization lies along the long axis of the cell (see the ellipse in FIG. 1a) oriented in the direction of magnetization of the reference layer, either parallel or anti-parallel thereto. This long axis is referred to as the easy axis (x), while the direction perpendicular to it is the hard axis (y). The cross section of FIG. 1a is given in FIG. 1b.

The digital information stored in the MTJ is thus encoded as the direction of magnetization of the free layer. FIG. 2 shows resistance R of such a MTJ element as a function of external field Hs along the orientation of the pinned layer magnetization. When the field is off, the two states with minimum and maximum resistances correspond to the free layer magnetization being parallel and anti-parallel to the pinned layer magnetization respectively. The field required to switch between the two states (Hs) is determined by the anisotropy energy of the element.

In a conventional MRAM application, two orthogonal external fields are used to program an MRAM cell such as 35. These are provided by current lines 31 and 32, as shown in FIG. 3. The bit line provides the easy axis field while the word line provides the hard axis field. To program a cell, both bit and word line currents are applied, the combination of these two fields overcoming the shape anisotropy to set the magnetization of the selected cell into a desired direction. Although cell 35 is the one that was selected, many other cells, along either a powered bit or word line, such as 33 or 32, also experience a field from either a bit line current or from a word line current, albeit smaller than the combined field that is experienced by the selected cell. Such cells are referred to as half-select cells. They are susceptible to being accidentally programmed and thereby causing an error.

Another shortcoming of this approach is the scaling difficulty: as dimensions grow smaller, thermal agitation may perturb stored information. This thermal effect is described by $$f = f_0 \cdot \exp\left(-\frac{B \cdot H_s \cdot M_s \cdot V}{k \cdot T}\right)$$

where f is the thermal switching frequency, $f_0$ and B are constants, k is the Boltzman constant, T is the temperature. To have a thermally stable stored information in the MRAM cell, the $\Delta = BH_s M_s tA$ has to be higher than a certain constant value. As dimension scales down, the area A is decreased, to maintain constant value of $\Delta$, the $$H_s = \frac{\Delta}{BM_s tA}$$

has to be increased, hence requiring higher switching current to write.

These two shortcomings can be avoided by thermally assisting the switching of the magnetization during the write operation, as described in Ref [1] as well as in U.S. Pat. Nos. 6,385,082, 6,704,220, and 6,771,534. The latter propose using joule heating to reduce the Ms value, and hence to lower Hs, while maintaining thermal stability when this heat is absent. However, in this scheme the choice of free layer material is limited by the requirement that a large enough magneto-resistance has to be achieved for there to be enough read signal for the detection of stored information. Thus the choice of free layer is usually limited to Co, Fe, Ni, and their mutual alloys. These all have high Curie temperatures so the current required to obtain a significant reduction of Ms is very high. They suggested use of rare earth ferromagnetic materials that have low Curie temperatures and lower magneto-resistance values than Co, Fe, Ni, and their mutual alloys. But these materials and are highly corrosive which makes for great process difficulties.

The other approach to overcoming half-select and scaling issues is an exchange biased design, described in Ref. [1], for current field writing, and in U.S. Pat. No. 7,110,287 for spin torque transfer writing, to couple the free layer to a low blocking temperature (Tb) AFM layer (separate from the AFM used to pin the reference layer which has a high blocking temperature).

A schematic drawing of this design is shown in FIG. 4. Shown there are second AFM layer 41 (which has lower Tb), seed layer 42, bottom electrode 43, and diode/transistor 44. Data storage is achieved by changing the direction of the exchange-coupling field (He) of second AFM 41 at free layer 11. This is achieved by sending a current pulse through the MTJ to heat AFM layer 41 above Tb so He goes to zero. The word line is then energized to provide a directional magnetic field at the free layer, following which the heating current is turned off so that the magnetized free layer of the MTJ cools in the presence of the word line field. This sets the magnetization of the free layer in the desired direction, either parallel or antiparallel to the reference layer's magnetization.

The anisotropic field to maintain stored data against thermal agitation is provided by the unidirectional field $$H_e = \frac{J}{2M_s t}$$

where J is the exchange coupling energy per unit area which is determined by the AFM and free layer material properties.

The problem with this design is that, in order to have low Tb, the AFM's thickness has to be small; but He drops, and its variability increases, rapidly with AFM thickness so one ends up with a wide range of He values distributed among the various memory elements. The temperature generated by the heating current has to overcome the AFM with the highest Tb, which means that a high current will be needed.

REFERENCES

[1] I. L. Prejbeanu et al. "Thermally Assisted Switching in Exchange-Biased Storage Layer Magnetic Tunnel Junctions", IEEE Trans. Mag. 40 No. 4, July 2004, 2625-2627.

A routine search of the prior art was performed with the following references of interest being found:

In U.S. 2008/0180991, Wang discloses a free layer containing nano-channels. In U.S. Pat. No. 7,375,405, Fukuzawa et al. show an AFM coupling layer of Rh, Ru, Cr, or Ir where magnetic pinning is performed at a temperature no higher than 300° C. Parkin, in U.S. Pat. No. 7,357,995, teaches a coupling layer comprising alloys of Cr with V, Nb, W, and Fe.

In U.S. Pat. No. 7,309,617, Reuhrig et al. disclose a reference layer oriented by cooling to below the Curie temperature. Their coupling layer comprised Ru, Au, or Co while Deak, in U.S. Pat. No. 7,230,844, teaches heating to near or above the Curie temperature for spin transfer.

SUMMARY OF THE INVENTION

It has been an object of at least one embodiment of the present invention to provide a method for eliminating the half-select problem in magnetic memory arrays.

Another object of at least one embodiment of the present invention has been for said method to increase the robustness of stored information in magnetic memory elements, despite size reductions of said memory elements.

Still another object of at least one embodiment of the present invention has been for said method to enable information to be stored in said memory elements in at least two different ways.

A further object of at least one embodiment of the present invention has been to provide a structure that is suitable for the implementation of said method.

These objects have been achieved by pinning the free layer magnetization via an AFM or antiferromagnetic layer (unrelated to the AFM that serves to pin the reference layer magnetization). As a key feature of the invention, a control valve layer (CV) is inserted between this AFM and the free layer (referred to as NF since it is a normal free layer). CV comprises ferromagnetic material that exchange couples this AFM to the free layer.

When CV is heated above its Curie temperature it becomes paramagnetic and no longer exchange-couples the AFM to the free layer so the magnetization of the latter is no longer pinned and can be switched, if so desired. Once switching is complete, CV is allowed to cool below its Curie temperature so that the AFM pins free layer NF once more. The necessary heating of CV is supplied by Joule heating that is generated by passing a current through the MTJ (or GMR) device. This Joule heating can be generated in the body of the device or in CV itself by giving CV the form of a matrix of ferromagnetic nano-channels embedded within an insulator.

Storing of information while free layer NF is in its unpinned state can be accomplished by generating magnetic fields in an additional wire having a bi-directional current capability which can provide a bi-directional setting field parallel or anti-parallel to the pinned layer, after passing a uni-directional heating current through the cell, or by a bi-directional current through the cell which provides heating and also sets the magnetization of the free layer through spin-torque transfer.

BRIEF DESCRIPTION OF THE DRAWINGS

FIGS. 1a, 1b, and 2 illustrate the basic operation of an MTJ device.

FIG. 3 shows how, in the prior art, certain memory cells may be half-selected.

FIG. 4 is a schematic cross section of two Spin Torque MRAMs of the prior art.

FIG. 5a illustrates how, in the present invention, a coupling layer has been inserted between a second AFM layer and the normal ferromagnetic free layer.

FIG. 5b illustrates using an anti-parallel coupling layer, between CV and the free layer, to further increase the robustness of the stored data FIG. 6 is a plot of Curie temperature vs. dopant concentration for NiX FIG. 7 plots both Curie temperature and saturation induction of a NiFe alloy as a function of nickel concentration.

DESCRIPTION OF THE PREFERRED EMBODIMENTS

Figure 8:
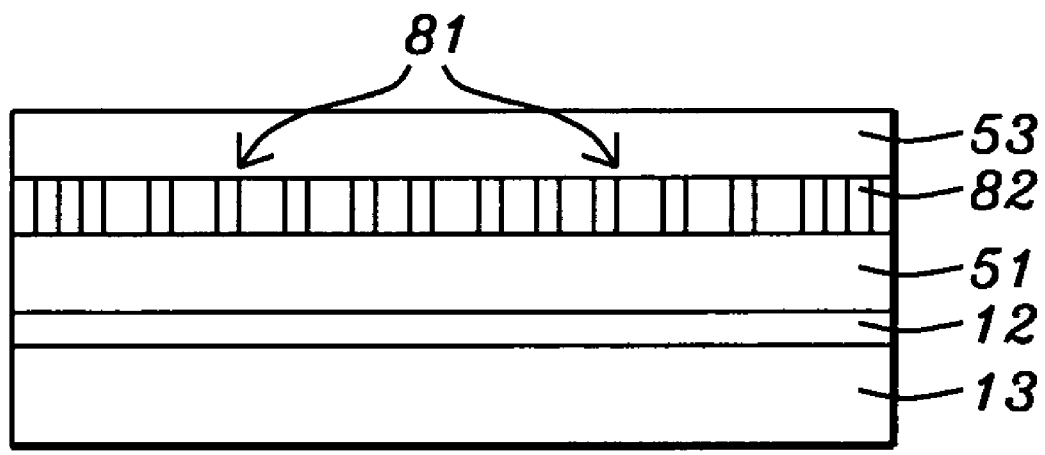
FIG. 8 is a schematic cross-section of a coupling valve layer having the form of magnetic nano-conducting channels embedded in insulation.

Referring now to FIG. 5a, the invention discloses a MRAM design utilizing a "coupling valve" switching mechanism. In this design, the MTJ's free layer is a composite of three layers:

1) A normal ferromagnetic layer 51 (NF) immediately adjacent to tunneling layer 12 (for highest MR value),
2) a coupling valve layer 52 (CV), and
3) a $2^{nd}$ antiferromagnetic (AFM) layer 53 having a high blocking temperature.

As a key feature of the invention, the coupling valve layer is engineered to behave in the following manner:

during storage (including read operations) it is ferromagnetic and is exchange coupled to both free layer NF and the $2^{nd}$ AFM layer so that the unidirectional field He from second AFM 53 acts on free layer NF via CV to maintain the magnetizations of both the NF and CV layers along the desired direction.

During a write operation, the CV layer has been heated above its Curie point by a current through the MTJ, causing it to lose its ferromagnetic property, so it can no longer provide exchange coupling between AFM layer 53 and free layer NF 51 whereby free layer NF no longer experiences the exchange field He of the AFM layer. Since free layer NF has intrinsically low or zero magnetic anisotropy, its magnetization can be easily set in the desired direction. Two methods are available for setting the magnetization of free layer NF 53:

1) by an external magnetic field generated by current flowing through the word line or the bit line, similar to the approach portrayed in FIG. 4, or
2) by spin torque transfer from a spin polarized current flowing through MTJ itself.

For (1), the external field case, CV layer 52 becomes ferromagnetic again when the heating current is turned off and it is magnetized in the direction set by the external field and free layer NF's exchange coupling. Then, when the current that generates the external field is turned off, the magnetizations of NF and CV will be set to be parallel or anti-parallel to the pinned layer, depending the word line (or bit line) current direction.

For (2), the spin torque transfer writing case, the direction of current flowing through the MTJ sets the magnetization direction of the free layer NF. The CV layer is chosen to be a magnetic layer with low Curie temperature (Tc) so, when the MTJ temperature is above Tc, the CV layer transforms from a ferromagnetic to a paramagnetic phase whereby exchange coupling is reduced to zero, thereby decoupling the free layer NF from AFM layer 53 and allowing easy writing of the free layer's magnetic direction through the spin-torque-transfer effect.

The blocking temperature of $2^{nd}$ AFM layer 53 needs to exceed the maximum temperature experienced by the MTJ so that its magnetic properties can remain unchanged during and after the write operation.

For the current generated (i.e. external) field writing case, the writing procedure can be further detailed as follows:

1) turn on the word (or bit) line current appropriate for the desired field direction, 2) send a pulse current through the MTJ via a diode (or transistor) so as to raise the MTJ free layer temperature above the CV layer's Tc, 3) allow the free layer to cool down with the word or bit line current field still present in order to set the NF and CV layers' magnetizations in their desired directions.

For the spin torque transfer writing case, the writing procedure can be further detailed as follows:

(a) To set the free layer magnetization parallel (from anti-parallel) to the reference layer's magnetization:
  (1) the CV is deactivated by passing a relatively high current pulse through the MTJ, so heat, diffusing mainly from the barrier layer, raises the CV's temperature above its Tc.
  (2) an excess of electrons flows from the reference layer into the free layer and are magnetically aligned with the reference layer, causing, through spin torque, free layer NF to be magnetized in the same direction as the reference layer,
  (3) once the CV temperature falls below Tc, the CV becomes exchange coupled to free layer NF and pins NF in its existing direction (parallel to the reference layer).
(b) The same sequence as above is used to set the free layer magnetization antiparallel (from parallel) to the reference layer's magnetization except that, in step 2, the electrons flow from the free layer into the reference layer so a majority of them are magnetically aligned parallel to the reference layer. The minority electrons with spin antiparallel to the pinned layer and the free layer will be reflected back from the pinned layer to free layer NF, through spin torque, causing free layer NF to be magnetized anti-parallel to the reference layer.

Since the coupling valve layer acts like a switching valve that turns exchange coupling between AFM and free layer NF on and off, so MRAMs having this type of free layer structure can be referred to as "coupling valve RAMs".

To further increase thermal stability, a synthetic antiferromagnetic structure (SAF) can be employed, as shown by FIG. 5b. During a data storage or reading operation, the CV layer is strongly coupled anti-parallel to free layer NF 51 via Ru, Rh, Re, Cu, or Cr layer 54. The magnetic moment of CV can be matched to that of NF, if so desired. Since the top and bottom layers of a SAF are anti-aligned to each other, He from the $2^{nd}$ AFM on SAF is greatly enhanced so there is no residual de-magnetizing field, making this structure thermally robust and thus capable of being scaled down to very small dimensions. During writing, when the CV layer has temporarily entered a paramagnetic state, its magnetic moment becomes zero. Hence the remaining magnetic moment of the SAF derives from the NF layer which can be easily set by a word/bit line current field or by spin torque transfer, as discussed above.

Implementation Details:

For the spin torque transfer version discussed above, the invention requires that the MTJ be accessed through a transistor able to provide, in addition to its normal service, a bidirectional current in the form of a short pulse at a high current level followed by a long pulse at a lower current level. Said bidirectional current is required to cause electrons to flow from the reference layer into the free layer when writing the free layer magnetization parallel to the reference layer's magnetization, and vice versa.

Note, too, that the invention can be implemented so that magnetization in both the free layer NF and the reference layers lies in the plane of the deposited film or the magnetization may be perpendicular to the film plane. In a perpendicular design, both magnetizations of the free layer and reference (pinned) layer are perpendicular to the film plane. The free layer magnetization can be set to be along or against the reference layer magnetization.

The perpendicular configuration is achievable in magnetic films such as FePt, CoPt, CoFeTb, CoFeGd, etc or in multilayer structures such as Fe/Pt, Co/Pt, Co/Ni, Fe/Pd, and Co/Pd, which have high perpendicular anisotropy; this overcomes the de-magnetization field enabling the magnetization to be stable perpendicular to the film plane. The advantages of the perpendicular configuration are that a very low current is needed and the MTJ cell can be given a circular shape which is smaller than the more conventional elliptical shape.

To construct the invention, a first preferred embodiment is to have the coupling valve layer made of magnetic material with low curie temperature, ranging from 85-~300° C. The free layer NF can be made of Co, Fe, Ni or their alloys, all of which have high curie temperatures (Tc of pure Ni ~358° C., pure bcc Co ~1130° C., pure Fe ~770° C.). The coupling valve layer can be any conducting, semiconducting or weakly insulating magnetic material with a curie temperature between 85 and ~300° C. Some examples are given below:

Ni, Fe, Co or alloys of form XY (where X=Ni, Fe, or Co, Y=Mo, Pt, V, Cr, Si, Al, Zn, Mn, Cu, Pd, C, Ce, B, S, or P, etc.) as shown in FIG. 6 for Ni.

A NiFe alloy with a Ni concentration around 30-35% can have a curie temperature around 120 to 250° C., as shown in FIG. 7. Other low curie temperature materials can be rare earths like CrTe (Tc ~100° C.); magnetic oxides like BeFeO$_4$ (Tc ~190° C.), Er$_2$O$_3$*Fe$_2$O$_3$ (Tc ~275° C.); semi-metals like Heusler alloys (Cu$_2$MnX where X=Al, In, Sn, Ga) or CoCrFeAl. The second AFM material can be any metallic antiferromagnetic material with a high blocking temperature such as MnX (X=Pt, Ir, Ru, Rh, Os, Ni, Fe) or MnXY (X or Y=Pt, Cr, Pd, Fe, Rh, Ru) and TbCo.

A second preferred embodiment is illustrated in FIG. 8. Here the coupling valve layer is a plurality of magnetic nano-conducting channels (NCC) 81 embedded in an insulating material (such as an oxide), these micro-channels being Co, Fe, Ni, or an alloy of these elements. During storage or read operations, AFM layer 53 continues to be exchange coupled to the free NF layer 51 through the magnetic nano-channels but during writing, the current will be concentrated within those nano-channels generating more heat to raise their temperature to be above their curie temperature thereby making them paramagnetic or super-paramagnetic which will decouple second AFM 53 from free layer NF.

Note that the use of a nano-channel in this environment is quite different from its role in a CPP GMR spacer layer. In the latter, the nano-channel serves to make the resistance component of the resistance area product as high as possible whereas in the device that forms the present invention the resistance of the NCC should be as low as possible while still concentrating the current to a sufficient degree to raise the local temperature above the Tc of the MAGNETIC material used to form the channels. This is unlike a GMR microchannel, which need not be, and preferably shouldn't be, magnetic.

What is claimed is:

1. A method to store magnetically encoded information in a magneto-resistive memory element (MR) that includes a non-magnetic layer on a reference layer, comprising:
    depositing, on said non-magnetic layer, a normal free layer (NF) having a first Curie temperature;
    depositing, on said NF, a coupling valve layer (CV), comprising ferromagnetic material having a second Curie temperature;
    depositing on said CV an antiferromagnetic layer (AFM), having a blocking temperature, said second Curie temperature being less than both said first Curie temperature and said blocking temperature;
    then, by passing an electric current through said MR, heating said CV to a temperature that is above said second Curie temperature, and below both said first Curie temperature and said blocking temperature, whereby said CV ceases to be ferromagnetic, thereby ceasing to provide exchange coupling between said AFM and said NF through said CV;
    while said CV is at said temperature, magnetizing said NF in a direction that lies along said NF's easy axis, thereby storing a 1 or a 0; and
    then allowing said CV to cool below said second Curie temperature whereby said AFM magnetically pins said NF in said direction through exchange coupling provided by said CV.

2. The method recited in claim 1 wherein the step of magnetizing said NF in a direction that lies along said NF's easy axis, thereby storing a 1 or a 0, is accomplished by exposing said NF to an external magnetic field generated at an intersection of a word line and a bit line by currents flowing simultaneously through said word and/or bit lines.

3. The method recited in claim 2 wherein the step of magnetizing said NF cannot influence free layer magnetization in MRs that share a bit line or a word line with said MR because all such free layers remain magnetically pinned while said magnetically encoded information is being stored.

4. The method recited in claim 1 wherein, following passage of said electric current to heat said CV to said temperature, a unidirectional current is passed through said MR such that electrons flow from said reference layer into NF whereby said electrons are magnetically aligned with said reference layer and thereby cause NF to be magnetized parallel to said reference layer through spin torque.

5. The method recited in claim 1 wherein, following passage of said electric current to heat said CV to said temperature, a unidirectional current is passed through said MR such that electrons flow from NF into said reference layer whereby said electrons are magnetically aligned antiparallel to said reference layer and thereby cause NF to be magnetized antiparallel to said reference layer through spin torque.

6. The method recited in claim 1 wherein the step of depositing a coupling valve layer further comprises embedding nano-conducting channels of ferromagnetic material within an insulating material, thereby increasing electrical resistance in said coupling valve and reducing thermal stress in said non-magnetic layer.

7. The method recited in claim 1 wherein said non-magnetic layer is a tunneling barrier layer whereby said MR is a magnetic tunneling junction.

8. The method recited in claim 1 wherein said non-magnetic layer is a metal whereby said MR is a Giant Magneto-Resistance device.

9. The method recited in claim 1 further comprising providing strong antiparallel coupling between said CV and said NF via a layer of Ru, Rh, Re, Cu, or Cr, and matching said CV's magnetic moment to that of said NF whereby there is no residual de-magnetization field.

10. The method recited in claim 1 wherein said first Curie temperature is in a range of from 358 to 1130° C.

11. The method recited in claim 1 wherein said second Curie temperature is in a range of from 120 to 200° C.

12. The method recited in claim 1 wherein said blocking temperature is in a range of from 250 to 450° C.

13. The method recited in claim 1 wherein said CV is selected from the group consisting of XY (wherein X is selected from the group consisting of Ni, Fe, and Co and their alloys, and Y is selected from the group consisting of Mo, Pt, V, Cr, Si, Al, Zn, Mn, Cu, Pd, C, Ce, B, S, P, rare earths, magnetic oxides, and semi-metals.

14. The method recited in claim 1 wherein said AFM is selected from the group consisting of MnX (where X=Pt, Ir, Ru, Rh, Os, Ni, or Fe), MnZ (where Z represents any two elements selected from Pt, Cr, Pd, Fe, Rh, and Ru), and TbCo.

15. A magneto-resistive memory element (MR) that includes a non-magnetic layer on a reference layer, comprising:
    on said non-magnetic layer, a normal free layer (NF) having a first Curie temperature;
    on said NF, a coupling valve layer (CV), comprising ferromagnetic material having a second Curie temperature;
    on said CV an antiferromagnetic layer (AFM), having a blocking temperature, said second Curie temperature being less than both said first Curie temperature and said blocking temperature; and
    connections to said MR for passing an electric current there through.

16. The magneto-resistive memory element described in claim 15 further comprising a word line and/or a bit line that intersect above or below said MR.

17. The magneto-resistive memory element described in claim 15 wherein said connections to said MR, for passing an electric current there through, further comprise one or more transistors that control direction and intensity for said electric current.

18. The magneto-resistive memory element described in claim 15 wherein said CV further comprises a plurality of nano-conducting channels of ferromagnetic material embedded within an insulating material.

19. The magneto-resistive memory element described in claim 15 wherein said non-magnetic layer is a tunneling barrier layer whereby said MR is a magnetic tunneling junction.

20. The magneto-resistive memory element described in claim 15 wherein said non-magnetic layer is a metal whereby said MR is a Giant Magneto-Resistance device.

21. The magneto-resistive memory element described in claim 15 wherein said CV and said NF are strongly antiparallel-coupled via a layer of Ru, Rh, Re, Cu, or Cr, and said CV's magnetic moment is matched to that of said NF whereby there is no residual de-magnetization field.

22. The magneto-resistive memory element described in claim 15 wherein said first Curie temperature is in a range of from 358 to 1130° C.

23. The magneto-resistive memory element described in claim 15 wherein said second Curie temperature is in a range of from 120 to 200° C.

24. The magneto-resistive memory element described in claim 15 wherein said blocking temperature is in a range of from 250 to 450° C.

25. The magneto-resistive memory element described in claim 15 wherein said CV is selected from the group consisting of XY (wherein X is selected from the group consisting of Ni, Fe, Co, and their alloys, and Y is selected from the group consisting of Mo, Pt, V, Cr, Si, Al, Zn, Mn, Cu, Pd, C, Ce, B, S, P, rare earths, magnetic oxides, and semi-metals.

26. The magneto-resistive memory element described in claim 15 wherein said AFM is selected from the group consisting of MnX (where X=Pt, Ir, Ru, Rh, Os, Ni, or Fe), MnZ (where Z represents any two elements selected from Pt, Cr, Pd, Fe, Rh, and Ru), and TbCo.

* * * * *